United States Patent [19]
Kinney

[11] Patent Number: 5,995,408
[45] Date of Patent: *Nov. 30, 1999

[54] NONVOLATILE FERROELECTRIC MEMORY WITH FOLDED BIT LINE ARCHITECTURE

[75] Inventor: Wayne I. Kinney, Boise, Id.

[73] Assignee: Micron Technology, Inc., Boise, Id.

[ * ] Notice: This patent is subject to a terminal disclaimer.

[21] Appl. No.: 09/201,522

[22] Filed: Nov. 30, 1998

Related U.S. Application Data

[63] Continuation of application No. 08/818,042, Mar. 14, 1997, Pat. No. 5,852,571.

[51] Int. Cl.$^6$ ............................................. G11C 11/22
[52] U.S. Cl. ........................... 365/145; 365/149; 365/210
[58] Field of Search ................................... 365/145, 149, 365/210

[56] References Cited

U.S. PATENT DOCUMENTS

| | | | |
|---|---|---|---|
| 4,476,547 | 10/1984 | Miyasaka | 365/205 |
| 4,809,225 | 2/1989 | Dimmler et al. | 365/145 |
| 4,873,664 | 10/1989 | Eaton, Jr. | 365/145 |
| 4,888,733 | 12/1989 | Mobley | 365/145 |
| 5,010,518 | 4/1991 | Toda | 365/145 |
| 5,086,412 | 2/1992 | Jaffe et al. | 365/145 |
| 5,218,566 | 6/1993 | Papaliolios | 365/145 |
| 5,305,273 | 4/1994 | Jinbo | 365/210 |
| 5,381,364 | 1/1995 | Chern et al. | 365/145 |
| 5,424,975 | 6/1995 | Lowrey et al. | 365/145 |
| 5,541,872 | 7/1996 | Lowrey et al. | 365/145 |
| 5,638,318 | 6/1997 | Seyyedy | 365/145 |
| 5,663,904 | 9/1997 | Arase | 365/145 |

FOREIGN PATENT DOCUMENTS

| | | |
|---|---|---|
| 0364813A2 | 4/1990 | European Pat. Off. . |
| 0364813A3 | 4/1990 | European Pat. Off. . |
| 0364813B1 | 4/1990 | European Pat. Off. . |

*Primary Examiner*—Huan Hoang
*Assistant Examiner*—Hoai V. Ho
*Attorney, Agent, or Firm*—Fletcher, Yoder & Van Someren

[57] ABSTRACT

A ferroelectric memory device having a folded bit line architecture. The ferroelectric memory device may include a selectable upper even memory cell connected to an upper even bit line, a sense amplifier having a first input and a second input; control circuitry operable to connect an upper odd bit line to a lower odd bit line at the first input of the sense amplifier, to connect the upper even bit line to the second input of the sense amplifier, and to isolate a lower even bit line from the second input of the sense amplifier; and a selectable lower odd reference cell, connected to the lower odd bit line.

22 Claims, 3 Drawing Sheets

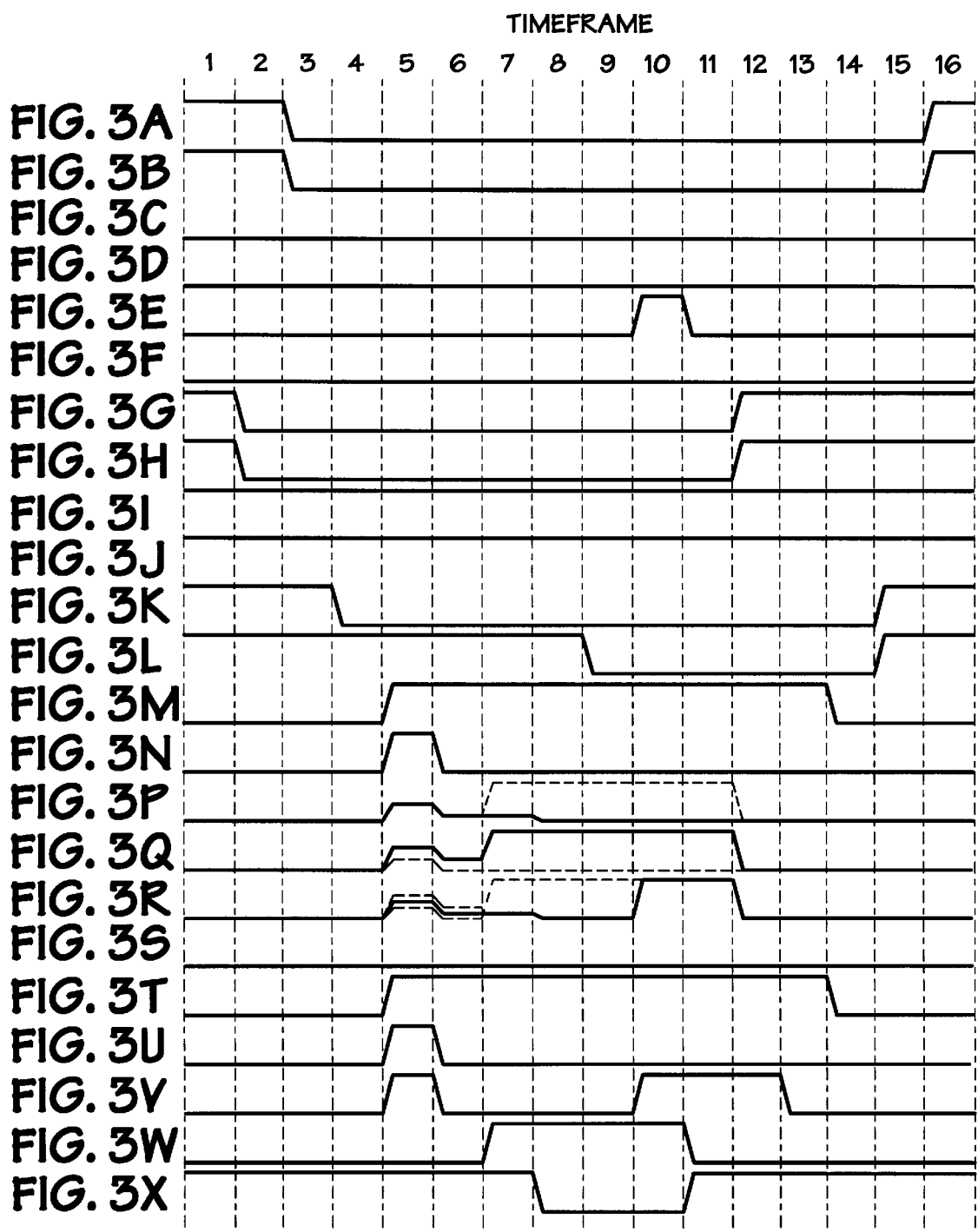

NONVOLATILE FERROELECTRIC MEMORY WITH FOLDED BIT LINE ARCHITECTURE

This application is a continuation of application Ser. No. 08/818,042 filed Mar. 14, 1997 now U.S. Pat. No. 5,852,571.

BACKGROUND OF THE INVENTION

1. Field of the Invention

The present invention relates to a ferroelectric memory device and, more specifically, to a ferroelectric memory device having a folded bit line architecture.

2. Description of the Related Art

Ferroelectric memory devices are generally well known in the data processing arts. Ferroelectric memories use ferroelectric capacitors for data storage. The ferroelectric capacitor is desirable because it may retain an electric field developed therein, even after a voltage applied to the capacitor to develop the field is removed. Therefore, ferroelectric memory cells do not require refreshing to retain a field stored therein.

A plurality of ferroelectric memory devices may be incorporated into a ferroelectric memory array. The memory array may be comprised of a plurality of word line rows, a plurality of plate line rows, and a plurality of bit line columns. Typically, memory cells and reference cells are attached to bit line columns, and these memory cells and reference cells are activated via signals on word line rows and the plate line rows provide the signals to be placed into memory. A memory cell may include a ferroelectric capacitor and an access transistor connecting it to a bit line. A reference cell may include a pair of oppositely charged ferroelectric capacitors and a pair of access transistors connecting these ferroelectric capacitors to a bit line.

One known architecture for the formation of a ferroelectric memory array is an open bit line architecture. In an open bit line architecture, a plurality of memory cells may be placed on a single bit line. This architecture permits a high component density. However, this architecture is also susceptible to electrical noise.

Another known architecture for the formation of a ferroelectric memory array is a folded bit line architecture. This architecture is not as susceptible to electrical noise as is the open bit line architecture, as the close spacing of cells in a folded bit line architecture provides good common mode rejection. However, the component density is somewhat less than for open bit line architecture. The present invention is directed to a folded bit line architecture.

SUMMARY OF THE INVENTION

In accordance with one aspect of the present invention, there is provided a ferroelectric memory device which may include a selectable upper memory cell coupled to an upper first bit line; a sense amplifier having a first and second input; control circuitry operable to couple an upper second bit line to a lower second bit line at the first input of the sense amplifier, to couple the upper first bit line to the second input of the sense amplifier, and to isolate a lower first bit line from the second input of the sense amplifier; and a selectable lower reference cell coupled to the lower second bit line.

In accordance with another aspect of the present invention, there is provided a method of operating a ferroelectric memory, which may include the steps of: isolating a lower even bit line from an upper even bit line, activating a memory cell coupled to the first bit line, activating a reference cell coupled to a second bit line, and comparing a voltage on the first bit line to a voltage on the second bit line.

The above brief summary of the invention, together with its attendant objects, advantages, and novel features, will become more readily understood with reference to the following description of the accompanying drawings.

BRIEF DESCRIPTION OF THE DRAWINGS

A better appreciation of the present invention may be gained from a study of the specific disclosed embodiments and of the drawings in which:

FIGS. 3A through 3N and 3P through 3X, generally, are a sequence of twenty-three waveform diagrams for the circuit represented in the schematic diagram of FIG. 2, and, more specifically, FIG. 3A depicts an exemplary waveform on upper equalization line 25 of FIG. 2;

FIG. 3B depicts an exemplary waveform on lower equalization line 31 of FIG. 2;

FIG. 3C depicts an exemplary waveform on upper odd charging line 22 of FIG. 2;

FIG. 3D depicts an exemplary waveform on upper even charging line 24 of FIG. 2;

FIG. 3E depicts an exemplary waveform on lower odd charging line 32 of FIG. 2;

FIG. 3F depicts an exemplary waveform on lower even charging line 34 of FIG. 2;

FIG. 3G depicts an exemplary waveform on upper discharging line 21 of FIG. 2;

FIG. 3H depicts an exemplary waveform on lower discharging line 35 of FIG. 2;

FIG. 3I depicts an exemplary waveform on upper even control line 26 of FIG. 2;

FIG. 3J depicts an exemplary waveform on upper odd control line 27 of FIG. 2;

FIG. 3K depicts an exemplary waveform on lower even control line 29 of FIG. 2;

FIG. 3L depicts an exemplary waveform on lower odd control line 30 of FIG. 2;

FIG. 3M depicts an exemplary waveform on even memory word line 14 of FIG. 2;

FIG. 3N depicts an exemplary waveform on even memory plate line 13 of FIG. 2;

FIG. 3P depicts an exemplary waveform on upper odd bit line 8 of FIG. 2;

FIG. 3Q depicts an exemplary waveform on upper even bit line 9 of FIG. 2;

FIG. 3R depicts an exemplary waveform on lower odd bit line 10 of FIG. 2;

FIG. 3S depicts an exemplary waveform on lower even bit line 11 of FIG. 2;

FIG. 3T depicts an exemplary waveform on lower odd reference word line 38 of FIG. 2;

FIG. 3U depicts an exemplary waveform on first lower odd reference plate line 37 of FIG. 2;

FIG. 3V depicts an exemplary waveform on second lower odd reference plate line 39 of FIG. 2;

FIG. 3W depicts an exemplary waveform on sense amplifier line 28; and

FIG. 3X depicts an exemplary waveform on second sense amplifier line 12.

While the invention may be adaptable to various modifications and alternative forms, specific embodiments have been shown by way of example and described herein. However, it should be understood that the invention may not be limited to the particular forms disclosed. Rather, the invention. is to cover all modifications, equivalents, and alternatives falling within the spirit and scope of the invention as defined by the appended claims.

DETAILED DESCRIPTION OF THE INVENTION

Figure 1:
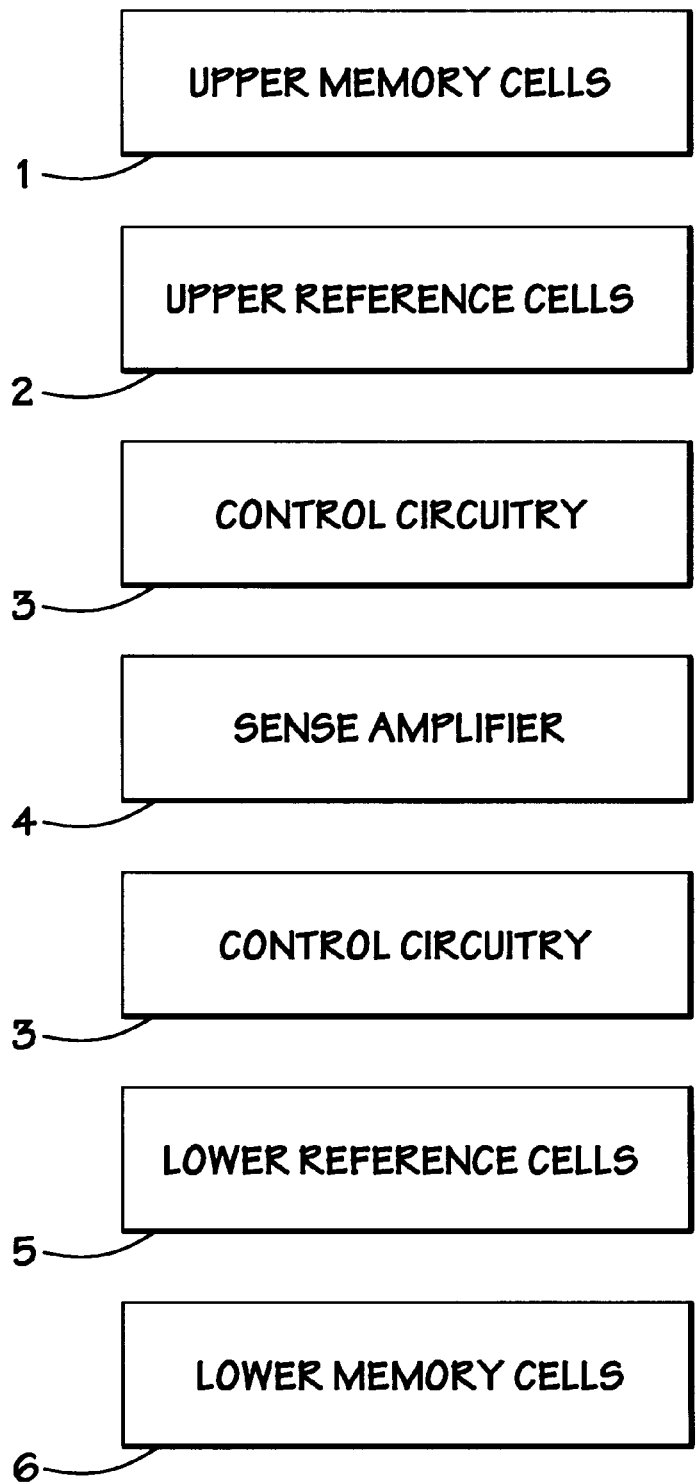
FIG. 1 is a block diagram of an exemplary embodiment of the invention.

FIG. 1 is a block diagram of an exemplary embodiment of the invention. In the exemplary embodiment, upper memory cells 1 may operate in conjunction with lower reference cells 5. Likewise, memory cells in lower array 6 may operate in conjunction with upper reference cells 2. It is to be understood in this block diagram that the individual blocks may be connected by one or more bit lines. In the exemplary embodiment, control circuitry 3 may be operable to charge, to discharge or isolate a bit line, or to equalize a plurality of bit lines. Sense amplifier 4 may be operable to differentiate between voltages on a plurality of bit lines.

Figure 2B:
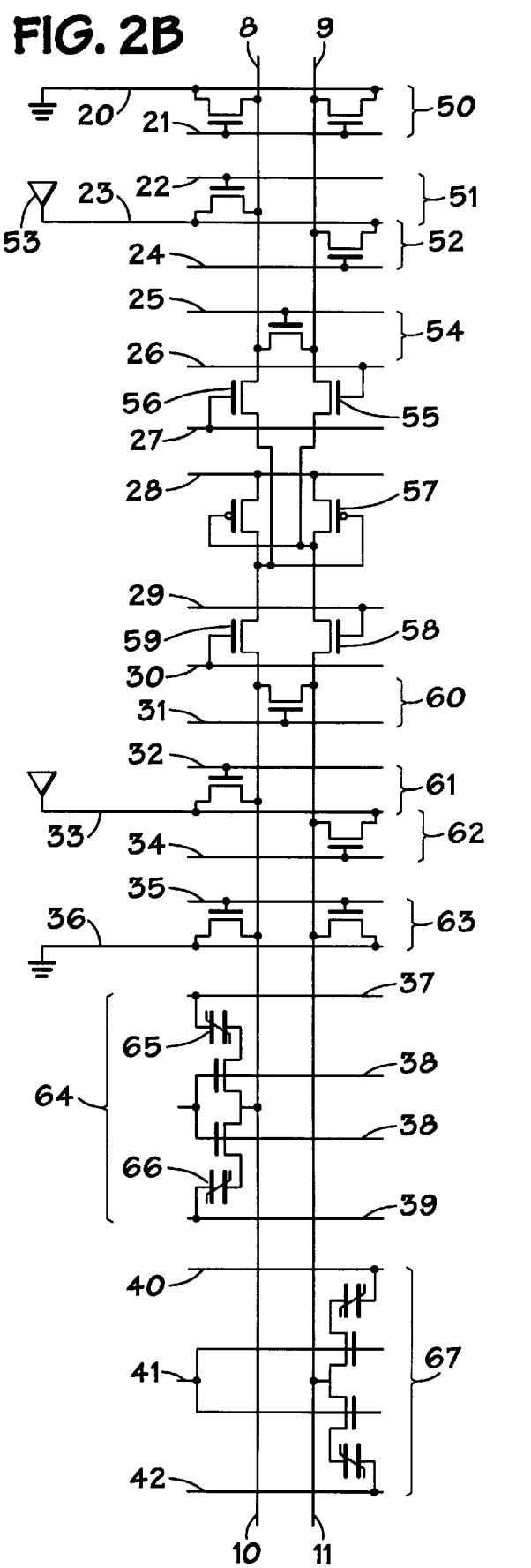
FIG. 2 is a schematic diagram representing an exemplary embodiment of the invention.
Figure 2A:
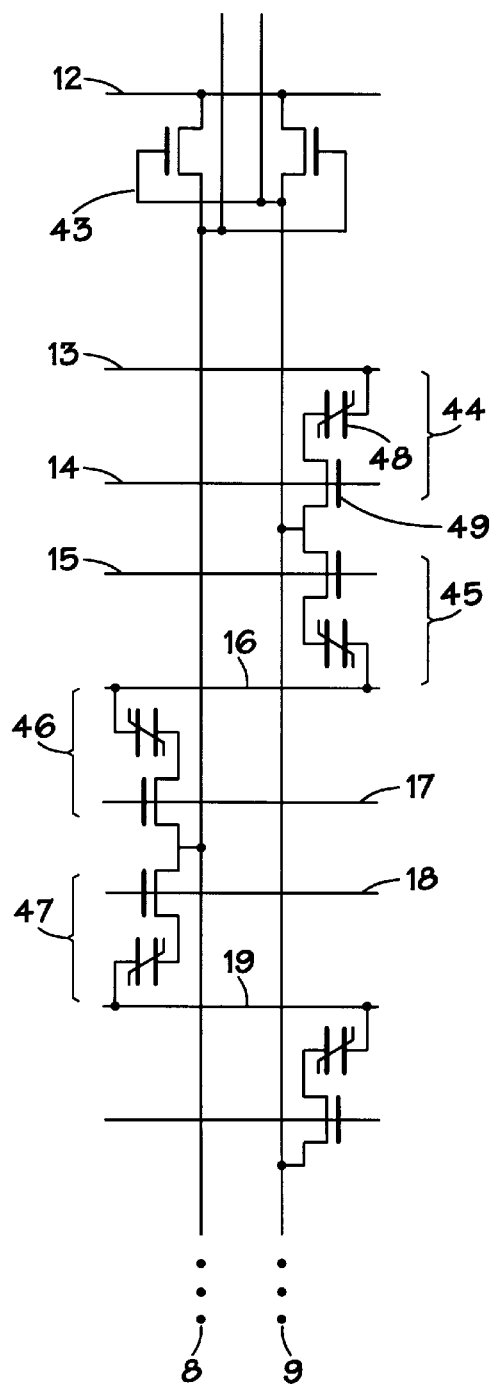

FIG. 2 is a schematic diagram representing an exemplary embodiment of the invention. In the exemplary embodiment, upper even memory cells 44 and 45 may operate in conjunction with lower reference cell 64. Although the schematic diagram depicts metal-oxide-semiconductor (MOS) transistors, it is to be understood that other switching devices may be substituted for the MOS transistors. Likewise, although the schematic diagram depicts a first sense amplifier 57 comprising two MOS transistors and a second sense amplifier 43 comprising two MOS transistors, it is to be understood that another embodiment may include a sense amplifier comprising any number of discrete elements. Alternately, another embodiment may use another means to compare two voltages.

FIGS. 3A through 3N and 3P through 3X depict an exemplary operation of the circuit represented in the schematic diagram of FIG. 2. Referring now to these figures, the upper odd bit line 8, the upper even bit line 9, the lower odd bit line 10, and the lower even bit line 11 may be in any state before the first timeframe. The exemplary operation shown in FIGS. 3A through 3N and 3P through 3X contemplates use of upper even memory cells 44 and 45 and use of lower odd reference cell 64. It is to be understood that other modes of operation may be used, such as upper odd memory cells 46 and 47 with lower even reference cell 67, for example.

Prior to activating the memory and reference cells, the bit lines may be grounded to eliminate residue charge. For example, in the first timeframe, upper discharge circuitry 50 is activated by applying the signal shown in FIG. 3G to upper discharging line 21, thus grounding upper odd bit line 8 and upper even bit line 9. Likewise, in the first timeframe, lower discharge circuitry 63 s activated by applying the signal shown in FIG. 3H to lower discharging line 35, thus grounding lower odd bit line 10 and lower even bit line 1. After discharging the bit lines, the discharge circuitry may be deactivated, as shown in timeframe 2 of FIG. 3G and 3H, by removing the signals on upper discharging line 21 and lower discharge circuitry 63.

Adjoining bit lines may be equalized to enhance common mode rejection. For example, upper odd bit line 8 may be equalized with upper even bit line 9. This is accomplished via the signal of FIG. 3A applied to upper equalization line 25. Likewise, lower odd bit line 10 may be equalized with lower even bit line 11. This is accomplished via the signal of FIG. 3B applied to lower equalization line 31. After adequately equalizing the bit lines, the equalization circuitry may be deactivated.

For the exemplary operation in which upper even memory cell 44 and lower odd reference cell 64 are to be activated, lower even bit line 11 may be isolated from the second input of sense amplifier 57. As shown in FIG. 3K, during the fourth timeframe, a low signal is applied to lower even control line 29. This step deactivates lower even control circuitry 58, isolating lower even bit line 11 from the second input of sense amplifier 57. Consequently, as shown in FIG. 3S, there is no charge on lower even bit line 11 throughout the exemplary operation.

With lower even bit line 11 isolated, upper odd bit line 8 may be connected to lower odd bit line 10 at the first input of sense amplifier 57, and upper even bit line 9 may be connected to the second input of sense amplifier 57. To achieve this end, upper even control circuitry 55 is activated by the signal shown in FIG. 3I applied to upper even control line 26. Also, upper odd bit line 8 is connected to the first input of sense amplifier 57 through upper odd control circuitry 56 turned on by the signal shown in FIG. 3J, applied to upper odd control line 27. Until the eighth timeframe of the exemplary operation, lower odd bit line 10 is also connected to the first input of sense amplifier 57 through lower odd control circuitry 59 turned on by the signal shown in FIG. 3L, applied to lower odd control line 30. This connection thereby substantially doubles the length of the odd bit line to include upper odd bit line 8 and lower odd bit line 10.

With lower even bit line 11 isolated, upper even memory cell 44 may be activated. Even memory plate line 13 of upper even memory cell 44 is pulsed in the fifth timeframe as shown in FIG. 3N. Simultaneously, word line 14 controlling access transistor 49 is turned on, as shown in FIG. 3M, thereby connecting ferroelectric capacitor 48 of upper even memory cell 44 to upper even bit line 9. This step places the charge stored on ferroelectric capacitor 48 onto upper even bit line 9.

Simultaneously in the fifth timeframe, lower odd reference cell 64 may be activated. First lower odd reference plate line 37 and second lower odd reference plate line 39 of lower odd reference cell 64 are pulsed as shown in FIGS. 3U and 3V respectively. The access transistors which tie these ferroelectric capacitors to the lower odd bit line are simultaneously turned on via a signal applied to lower odd reference word line 38, as shown in FIG. 3T.

These operations cause the charge stored on the ferroelectric capacitor 48 of upper even memory cell 44 to be transferred to upper even bit line 9, as shown in the fifth timeframe of FIG. 3Q; one possible charge is represented by the solid line, and the other possible charge is represented by the dotted line. Simultaneously, as shown in FIG. 3R, lower odd reference cell 64 transfers the charge on first lower odd reference ferroelectric capacitor 65, shown by a first dotted line, and the charge on second lower odd ferroelectric capacitor 66, shown by a second dotted line, to lower odd bit line 10, so that the average of the two charges is placed on lower odd bit line 10, as indicated by the solid line in FIG. 3R. Because lower odd bit line 10 is connected to the first input of sense amplifier 57 through lower odd control circuitry 59 activated by the signal in FIG. 3L and upper odd bit line 8 is also connected to the first input of sense amplifier 57, the signal on lower odd bit line 10 shown in FIG. 3R is substantially reproduced on upper odd bit line 8 as shown in FIG. 3P to provide a signal to the second sense amplifier 43.

In the exemplary embodiment, sense amplifier 57 is operable to latch up either upper even bit line 9 or the connected odd bit lines to a logic state of full one. In the seventh timeframe, sense amplifier line 28 is turned on, as shown in FIG. 3W. In the exemplary operation, since the upper even bit line signal represented by the solid line in FIG. 3Q in the sixth timeframe is greater than the odd bit line signal represented by the solid line in FIGS. 3P and 3R, sense amplifier 57 forces upper even bit line 9 high, as shown in FIG. 3Q. If, however, the upper even bit line signal was less than the odd bit line signal, sense amplifier 57 would force upper odd bit line 8 and lower odd bit line 10 high, as shown by the dotted lines in FIGS. 3P, 3Q, and 3R.

In the exemplary embodiment, second sense amplifier 43 is operable to latch up either upper even bit line 9 or the connected odd bit lines to a logic state of full zero. In the eighth timeframe, second sense amplifier line 12, normally on, is turned off, as shown in FIG. 3X. In the exemplary operation, since the upper even bit line signal represented by the solid line in FIG. 3Q is greater than the odd bit line signal represented by the solid line in FIGS. 3P and 3R, second sense amplifier 43 forces upper odd bit line 8 and lower odd bit line 10 low, as shown by the solid line in FIGS. 3P and 3R. If, on the other hand, the upper even bit line signal were less than the odd bit line signal, second sense amplifier 43 would force upper even bit line 9 low, as shown by the dotted lines in FIGS. 3P, 3Q, and 3R.

Once the bit line signals have been latched to opposite logic states, they may be sent to desired locations external to the memory circuit. Then, in the ninth timeframe, lower odd bit line 10 is isolated from the first input of sense amplifier 57 via deactivation of lower odd control circuitry 59 as shown by the signal in FIG. 3L applied to the lower odd control line 30.

At this time, an exemplary operation of the memory circuit may precharge the reference cell back to opposite polarities and reset the circuit for another operation. For example, in the tenth timeframe, lower odd charging circuitry 61 is turned on by the pulse on lower odd charging line 32 shown in FIG. 3E. Note that during the course of the exemplary operation, no pulses are applied to upper odd charging line 22 (FIG. 3C), upper even charging line 24 (FIG. 3D), or lower even charging line 34 (FIG. 3F). Also in the tenth timeframe, a voltage is applied to second lower odd reference plate line 39, as shown in FIG. 3V. By applying a voltage only to the second lower odd reference plate line 39, reference ferroelectric capacitors 65 and 66 are charged to opposite polarities, as desired for proper operation of the reference circuitry.

In the twelfth timeframe, upper bit line discharge circuitry 50 and lower bit line discharge circuitry 63 are turned on as shown in FIGS. 3G and 3H. These signals thereby discharge the bit lines of any residue charge remaining from the charging operation described above.

In the thirteenth timeframe, the voltage applied to second lower odd reference plate line 39 is removed, as shown in FIG. 3V. Then in timeframe 14, word line 14 and lower odd reference word line 38 are forced low, as shown in FIGS. 3M and 3T. These lines cause upper even memory cell 44 and lower odd reference cell 64 to be disabled. Then lower isolation line 29 is activated as shown in FIG. 3K to thereby permit upper even bit line 9 and lower even bit line 11 to be reconnected.

Thereafter, upper bit lines and lower bit lines may be connected via the first and second inputs of first sense amplifier 57. A high signal may be applied to lower even control line 29, thereby connecting upper even bit line 9 to lower even bit line 11 at the second input of sense amplifier 57. Similarly, a high signal may be applied to lower odd control line 30, thereby connecting upper odd bit line 8 to lower odd bit line 10 at the first input of sense amplifier 57.

Finally, the signals of FIGS. 3A and 3B in timeframe 16 may be applied to upper equalization line 25 and lower equalization line 31 to thereby equalize upper even bit line 9 and upper odd bit line 11, and equalize lower even bit line 11 and lower odd bit line 10, thereby placing the memory circuit in a condition to perform a next desired operation.

What is claimed is:

1. A memory device having a folded bit line architecture, comprising:

a selectable first upper memory cell, coupled to a first upper bit line and a first lower bit line;

a first sense amplifier having a first input and a second input;

control circuitry operable to couple a second upper bit line to a second lower bit line at the first input of the first sense amplifier, to couple the first upper bit line to the second input of the first sense amplifier, and to isolate the first lower bit line from the second input of the first sense amplifier, wherein the sum of the length of the second upper bit line and the length of the second lower bit line equals substantially twice the length of the first upper bit line; and a selectable first lower reference cell coupled to the second lower bit line.

2. The memory device of claim 1, further comprising:

a second sense amplifier having a first input coupled to the first upper bit line and a second input coupled to the second upper bit line.

3. The memory device of claim 1, wherein the control circuitry comprises:

a first lower switching device coupled to the second input of the first sense amplifier and to the first lower bit line, the first lower switching device being operable to isolate the first lower bit line from the second input of the first sense amplifier.

4. The memory device of claim 1, wherein the first upper memory cell comprises:

a first ferroelectric capacitor, the first ferroelectric capacitor having a first plate and a second plate, the first plate being coupled to a first plate line and the second plate being coupled to the first upper bit line through a first access transistor, the first access transistor being controlled by a first word line; and a second ferroelectric capacitor, the second ferroelectric capacitor having a third plate and a fourth plate, the third plate being coupled to a second plate line and the fourth plate being coupled to the first upper bit line through a second access transistor, the second access transistor being controlled by a second word line.

5. The memory device of claim 1, wherein the first upper memory cell comprises:

a ferroelectric capacitor having a first plate and a second plate, the first plate being coupled to a first plate line and the second plate being coupled to the first upper bit line through a first access transistor, the first access transistor being controlled by a first word line.

6. The memory device of claim 1, further comprising:

a selectable second upper memory cell coupled to the second upper bit line;

control circuitry operable to couple the first upper bit line to the first lower bit line at the second input of the first sense amplifier, to couple the second upper bit line to the first input of the first sense amplifier, and to isolate the second lower bit line from the first input of the first sense amplifier; and a selectable second lower reference cell coupled to the first lower bit line.

7. The memory device of claim 2, wherein the first sense amplifier comprises a positive sense amplifier and wherein the second sense amplifier comprises a negative sense amplifier.

8. The memory device of claim 1, further comprising:

discharge circuitry operable to selectively couple at least one of the first upper bit line, the second upper bit line, the first lower bit line, and the second lower bit line to electrical ground.

9. The memory device of claim 8, wherein the discharge circuitry comprises a discharge transistor controllable via a discharging line.

10. The memory device of claim 1, further comprising:

charge circuitry operable to selectively couple at least one of the first upper bit line, the second upper bit line, the first lower bit line, and the second lower bit line to a charging source.

11. The memory device of claim 10, wherein the charge circuitry comprises a charge transistor controllable via a charging line.

12. The memory device of claim 1, further comprising equalization circuitry operable to couple the first upper bit line to the second upper bit line.

13. The memory device of claim 12, wherein the equalization circuitry comprises an equalization transistor controlled via an equalization line.

14. A method of operating a memory, comprising the acts of:

(a) isolating a first lower bit line from a first upper bit line;

(b) activating a memory cell coupled to the first upper bit line to place a voltage onto the first upper bit line;

(c) activating a reference cell connected to a second bit line to place a voltage onto the second bit line, wherein the length of the second bit line equals substantially twice the length of the first upper bit line; and (d) differentially comparing said voltage on the second bit line to said voltage on the first upper bit line.

15. The method of claim 14, wherein act (d) comprises the acts of:

inputting said voltage on the second bit line into a first input of a sense amplifier; and inputting said voltage on the first upper bit line into a second input of said sense amplifier.

16. The method of claim 14, further comprising the act of:

latching said second bit line to a full logic one if said first input is greater than said second input.

17. The method of claim 14, further comprising the act of:

latching said first upper bit line to a full logic one if said second input is greater than said first input.

18. A memory device having a folded bit line architecture, comprising:

a first memory cell having a first capacitor, the first capacitor having a first plate and a second plate, the first plate being coupled to a first plate line and the second plate being coupled to a first bit line through a first access transistor, the first access transistor being controlled by a first word line;

a second memory cell having a second capacitor, the second capacitor having a third plate and a fourth plate, the third plate being coupled to a second plate line and the fourth plate being coupled to the first bit line through a second access transistor, the second access transistor being controlled by a second word line;

a third memory cell having a third capacitor, the third capacitor having a fifth plate and a sixth plate, the fifth plate being coupled to the second plate line and the sixth plate being coupled to a second bit line through a third access transistor, the third access transistor being controlled by a third word line; and a fourth memory cell having a fourth capacitor, the fourth capacitor having a seventh plate and an eighth plate, the seventh plate being coupled to a third plate line and the eighth plate being coupled to the second bit line through a fourth access transistor, the fourth access transistor being controlled by a fourth word line, wherein the length of the second bit line is substantially doubled when the reference cell is coupled to the second bit line, and wherein the length of the first bit line is substantially doubled when the reference cell is coupled to the first bit line.

19. The memory device of claim 18, further comprising:

a reference cell comprising a pair of oppositely-charged capacitors coupled to one of the first and second bit lines through a pair of access transistors controlled by a reference word line.

20. The memory device of claim 19, further comprising a sense amplifier having a first input coupled to the second bit line and a second input coupled to the first bit line.

21. The memory device of claim 19, wherein the length of the second bit line is substantially doubled when the reference cell is coupled to the second bit line, and wherein the length of the first bit line is substantially doubled when the reference cell is coupled to the first bit line.

22. A memory array comprising:

a plurality of selectable memory cells, each of said plurality of selectable memory cells being coupled to one of a plurality of first bit lines;

a plurality of selectable reference cells, each of said plurality of selectable reference cells being coupled to one of a plurality of second bit lines; and a plurality of control circuits, each of said plurality of control circuits operable to couple one of a plurality of third bit lines to one of said plurality of second bit lines at a first input of a sense amplifier, to couple one of said plurality of first bit lines to a second input of the sense amplifier, and to isolate one of said plurality of second bit lines from the second input of the sense amplifier, wherein the sum of the length of each respective third bit line and the length of each respective second bit line equals substantially twice the length of each respective first bit line.

* * * * *

UNITED STATES PATENT AND TRADEMARK OFFICE
CERTIFICATE OF CORRECTION

PATENT NO. : 5,995,408　　　　　　　　　　　　　　　　　　　　　　Page 1 of 1
DATED : November 30, 1999
INVENTOR(S) : Wayne I. Kinney It is certified that error appears in the above-identified patent and that said Letters Patent is hereby corrected as shown below:

Please insert the following paragraph immediately after the title:

—GOVERNMENT LICENSE RIGHTS

The U.S. Government has a paid-up license in this invention and the rights in limited circumstances to require the patent owner to license others on reasonable terms as provided for the terms of Contract No. MDA972-94-C-0006 awarded by the Advanced Research Projects Agengy (ARPA).—

Signed and Sealed this

Fifth Day of June, 2001

*Attest:*

*Attesting Officer*

NICHOLAS P. GODICI

*Acting Director of the United States Patent and Trademark Office*